United States Patent [19]

Naylor et al.

[11] Patent Number: 5,172,019
[45] Date of Patent: Dec. 15, 1992

[54] BOOTSTRAPPED FET SAMPLING SWITCH

[75] Inventors: Jimmy R. Naylor; Mark A. Shill, both of Tucson, Ariz.

[73] Assignee: Burr-Brown Corporation, Tucson, Ariz.

[21] Appl. No.: 822,586

[22] Filed: Jan. 17, 1992

[51] Int. Cl.$^5$ .................. H03K 17/687; H03K 1/12
[52] U.S. Cl. .................................. 307/578; 307/352; 307/353; 307/572; 328/151; 341/163; 341/172
[58] Field of Search ............... 307/352, 353, 362, 494, 307/572, 578; 328/151; 341/163, 172

[56] References Cited

U.S. PATENT DOCUMENTS

| | | | |
|---|---|---|---|
| 3,448,293 | 6/1969 | Russell | 307/572 |
| 3,875,516 | 4/1975 | Thomas | 328/151 |
| 3,938,049 | 2/1976 | Acker et al. | 328/151 |
| 3,942,039 | 3/1976 | Kikuchi et al. | 307/572 |
| 4,195,282 | 3/1980 | Cameron | 341/172 |
| 4,239,990 | 12/1980 | Hong et al. | 307/578 |
| 4,704,550 | 11/1987 | Hechtman | 307/571 |
| 4,764,750 | 8/1988 | Kawada | 341/163 |
| 4,831,381 | 5/1989 | Hester | 341/163 |
| 4,940,983 | 7/1990 | Jones et al. | 341/163 |
| 5,084,634 | 1/1992 | Gorecki | 307/352 |

FOREIGN PATENT DOCUMENTS 0091023  4/1987  Japan ..................... 341/172

*Primary Examiner*—Janice A. Howell
*Assistant Examiner*—Terry D. Cunningham
*Attorney, Agent, or Firm*—Cahill, Sutton & Thomas

[57] ABSTRACT

In an analog-to-digital converter, a circuit for sampling an analog input signal that has a signal range above and below a ground reference voltage includes a divider circuit scaling the analog input signal down to a lower magnitude such that all values of the scaled analog input signal are above the ground reference voltage. The scaled down analog input signal is applied to a source electrode of a sampling MOSFET. A body-to-source voltage of the sampling MOSFET is maintained at approximately zero volts by applying the scaled down signal to a non-inverting input of a first operational amplifier and applying an output voltage produced by the first operational amplifier to its inverting input and a body electrode of the sampling MOSFET. A gate-to-source voltage of the sampling MOSFET is maintained at approximately 1.5 volts by applying the scaled down analog input signal to a non-inverting input of a second operational amplifier, an output of which is applied to a gate electrode of the sampling MOSFET and to a gate electrode of a first MOSFET. A constant current is forced through the first MOSFET, producing therein a constant gate-to-source voltage independent of variation in the analog input signal. The resulting voltage on the source of the first MOSFET is applied to an inverting input of the second operational amplifier, so the constant gate-to-source voltage of the first MOSFET is imposed between the gate and source of the sampling MOSFET.

17 Claims, 1 Drawing Sheet

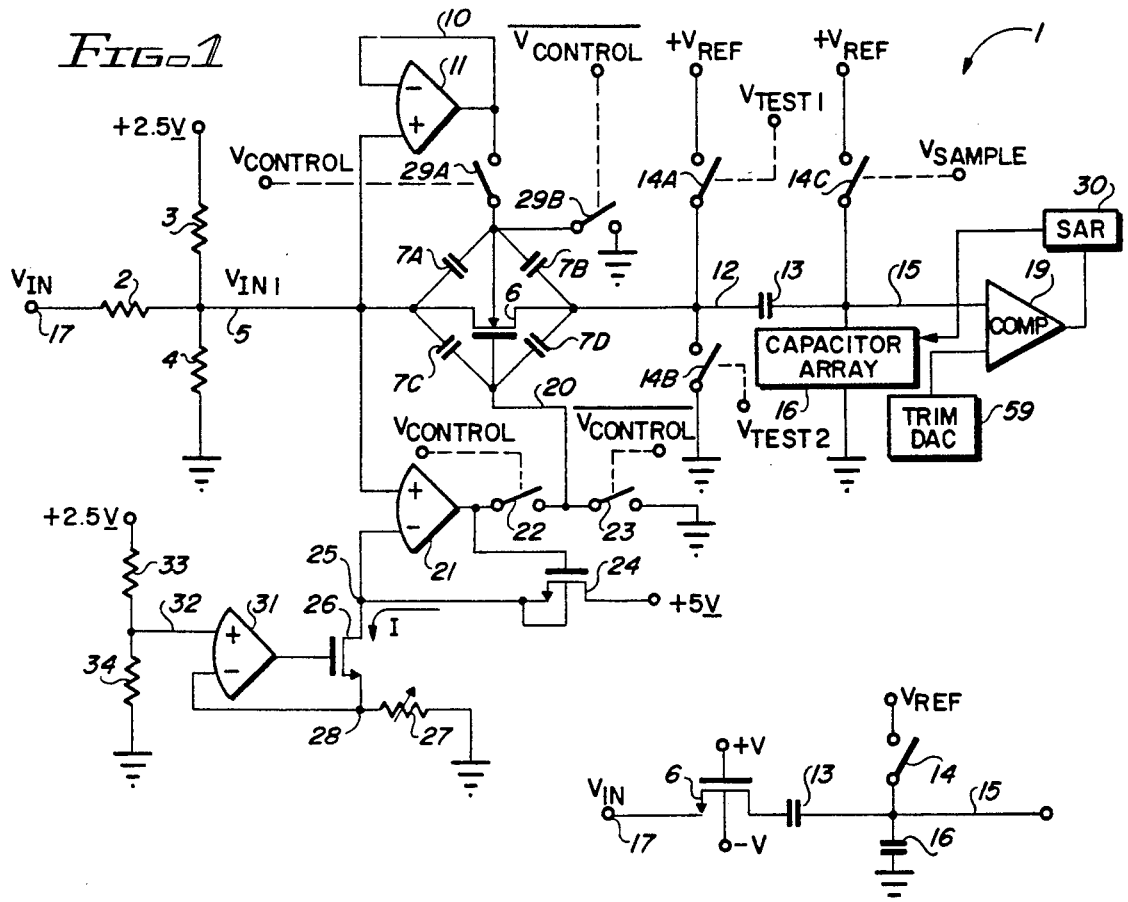
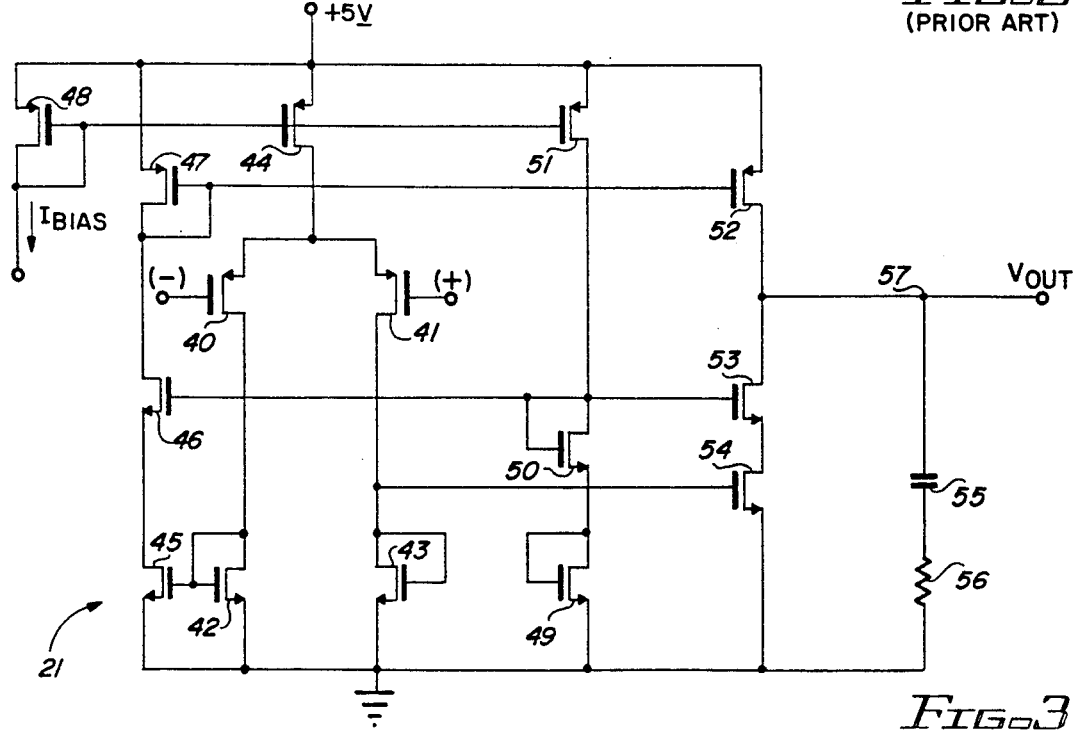

BOOTSTRAPPED FET SAMPLING SWITCH

BACKGROUND OF THE INVENTION

The invention relates to MOSFET sampling switch circuits, and particularly to a bootstrapped MOSFET sampling switch circuit that operates on a single power supply voltage, has an input signal that ranges above and below a ground voltage, and nevertheless produces a constant channel resistance in the MOSFET over a range of input voltages, and hence results in low total harmonic distortion of a sampled input signal.

FIG. 2 shows the connections during the "tracking" or "sampling" mode of a conventional analog sampling switch that includes an N channel MOSFET 6 having its gate electrode connected to $+V$, its source connected by conductor 17 to receive an analog input voltage $V_{IN}$, and its drain connected by sampling capacitor 13 to an output conductor 15. Conductor 15 is connected to a CDAC switched capacitor array represented by numeral 16 and to a comparator having its output coupled to a successive approximation register (not shown). The bulk or body electrode of MOSFET 6 is connected to $-V$ volts.

A problem with the circuit of FIG. 2 is that the gate-to-source voltage (which partially determines the channel resistance $R_{DS}$ of MOSFET 6) is quite low, typically only a few volts. The gate-to-source voltage of MOSFET 6 varies considerably as $V_{IN}$ varies. This gate-to-source voltage variation causes a varying channel resistance of sampling MOSFET 6. Furthermore, the threshold voltage $V_{TH}$ of MOSFET 6, which also influences the channel resistance, is a strong function of the voltage between its source electrode and its body electrode. The source-to-bulk voltage varies considerably as $V_{IN}$ varies, producing further changes in the channel resistance of sampling MOSFET 6 as a function of the input voltage $V_{IN}$. Consequently, a considerable amount of harmonic distortion is produced in the sampled version of $V_{IN}$ that is stored on sampling capacitor 13 by charging it through the non-linear channel resistance $R_{DS}$ of sampling MOSFET 6.

If conductor 15 is connected to the capacitor array of a CDAC (Capacitor Digital-to-Analog Converter), such harmonic distortion produces errors in the digital output word produced by the analog-to-digital converter to represent the time-varying analog input voltage $V_{IN}$.

It would be desirable to provide an analog sampling switch circuit that produces a constant channel resistance in a switching MOSFET even though the circuit operates from a single 5 volt power supply, and even though the analog input signal might be a sinusoidal waveform having bipolar values between $+10$ volts and $-10$ volts. Although the sampling MOSFET 6 can be made more linear by bootstrapping its gate voltage in somewhat the same manner described in commonly assigned co-pending allowed patent application Ser. No. 602,705, filed Oct. 24, 1990, entitled "DYNAMIC INPUT SAMPLING SWITCH FOR CDACS", that circuit requires a continuous clock signal to keep the bootstrap circuit operating, and will not work if the sampling device is turned on intermittently. That circuit requires a $+5$ volt power supply and a $-5$ volt power supply.

SUMMARY OF THE INVENTION

It is an object of the invention to provide a MOSFET sampling switch circuit that avoids introducing harmonic distortion into a sampled representation of an analog input voltage, yet operates from a single power supply voltage.

It is another object of the invention to provide an analog sampling switch circuit for a CDAC in an analog-to-digital converter operating from a single 5 volt power supply with an analog input voltage that assumes values substantially above and below a ground voltage, wherein harmonic distortion introduced by the sampling switch circuit into the sampled voltage is very low.

It is another object of the invention to obtain tracking accuracy of both the body electrode and the gate electrode relative to the source electrode of sampling MOSFET 6 to within as little as 10 to 20 millivolts at the Nyquist frequency.

It is another object of the invention to provide a constant current source circuit having high output impedance that can sustain constant levels of output current at a very low output voltage, for example as low as 0.3 volts.

Briefly described, and in accordance with one embodiment thereof, the invention provides a bootstrapped analog MOSFET sampling switch circuit that includes a sampling MOSFET having a drain electrode coupled by a sampling capacitor to an output conductor and a divider circuit coupling an analog input signal to a source electrode of the sampling MOSFET. A first operational amplifier has a non-inverting input coupled to the source electrode of the sampling MOSFET. An inverting input of the first operational amplifier is coupled to its output and to a body electrode of the sampling MOSFET. A second operational amplifier has an output coupled to a gate electrode of the sampling MOSFET and a non-inverting input coupled to the source electrode of the sampling MOSFET. A first MOSFET has a gate electrode coupled to the gate electrode of the sampling MOSFET, a drain electrode coupled to receive a positive supply voltage, and a source electrode coupled to an inverting input of the second operational amplifier. A second MOSFET has a drain electrode coupled to the source electrode of the first MOSFET and one terminal of a resistor having a second terminal coupled to the reference voltage conductor. A third operational amplifier having an output coupled to a gate electrode of the second MOSFET, a non-inverting input coupled to a bias voltage source, and an inverting input coupled to the source of the second MOSFET maintains a constant voltage across the resistor and thereby causes a constant current to flow through the second MOSFET. The second operational amplifier therefore maintains a constant gate-to-source voltage of the sampling MOSFET which is essentially equal to a constant gate-to-source voltage of the first MOSFET, thereby keeping the channel resistance of the sampling MOSFET constant in the face of a changing analog input voltage and resulting in low total harmonic distortion in the sampling switch circuit. In the described embodiment, the sampling switch circuit is included in a successive approximation type of analog-to-digital converter containing a switched capacitor CDAC array, a comparator, and a successive approximation register.

BRIEF DESCRIPTION OF THE DRAWINGS

FIG. 1 is a schematic diagram of the bootstrapped sampling switch of the present invention.

FIG. 2 is a schematic diagram of a conventional MOSFET sampling switch.

FIG. 3 is a schematic diagram of the operational amplifiers included in FIG. 1.

DETAILED DESCRIPTION OF THE PREFERRED EMBODIMENTS

Referring to FIG. 1, bootstrapped MOSFET sampling switch circuit 1 receives a sinusoidal input voltage $V_{IN}$ that varies between +10 volts and −10 volts on conductor 17. Twenty kilohm resistor 2 is connected between conductors 17 and 5. Four kilohm resistor 3 is connected between a +2.5 volt reference voltage and conductor 5. Ten kilohm resistor 4 is connected between conductor 5 and ground. From $V_{IN}$ varying between ±10 volts, a scaled input voltage $V_{IN1}$ is produced by the voltage divider formed by resistors 2, 3, and 4 on conductor 5 with signal levels varying between 0.3 volts and 2.8 volts.

N channel sampling MOSFET 6 has a source electrode connected by conductor 5 to the non-inverting inputs of operational amplifiers 11 and 21. A body electrode of sampling MOSFET 6 is coupled by switch 29A and conductor 10 to the output and the inverting input of operational amplifier 11. The drain electrode of sampling MOSFET 6 is connected by conductor 12 to one terminal of a sampling capacitor 13, the other terminal of which is connected to conductor 15. Conductor 12 is connected by switch 14A to a reference voltage $V_{REF}$, which may be the same as or different than the above-mentioned +2.5 volt supply voltage. Conductor 12 is connected by switch 14B to ground. Switch 14A closes in response to a voltage $V_{TEST1}$ and switch 14B is closed in response to $V_{TEST2}$ to effectuate testing of the MSB bit as is illustrated in FIG. 1, starting with the MSB (most significant bit) of a CDAC capacitor array that includes sampling capacitor 13 and a switched capacitor array represented by numeral 16. The testing is performed by comparator 19 and SAR 30. Conductor 15 is connected by switch 14C to $+V_{REF}$, which may be the same as or different from that 2.5 volt reference voltage. Switch 14C closes in response to $V_{SAMPLE}$. Switch 29B connects the body electrode of sampling MOSFET 6 to ground. Switch 29A closes in response to $V_{CONTROL}$. Switch 29B closes in response to $\overline{V}_{CONTROL}$.

The portion of the CDAC array represented by reference numeral 16 is connected between conductor 15 and ground. Conductor 15 also is connected to a comparator 19, the output of which is connected to a successive approximation register (SAR) 30 that controls switches (not shown) in switched capacitor array 16 and switches 14A and 14B, to thereby form an analog-to-digital converter. Typically, comparator 19 compares the voltage on conductor 15 due to testing of the present bit to a voltage produced by a trim DAC 59.

A gate electrode of sampling MOSFET 6 is coupled by conductor 20 and switch 22 to the output of operational amplifier 21. Switch 22 closes in response to a control signal $V_{CONTROL}$. Conductor 20 also is connected by switch 23 to ground. Switch 23 closes in response to $\overline{V}_{CONTROL}$. The output of operational amplifier 21 also is connected to the gate electrode of N channel MOSFET 24.

The drain electrode of MOSFET 24 is coupled to a positive supply voltage conductor. The source electrode of MOSFET 24 is connected by conductor 25 to the inverting input of operational amplifier 21 and to the drain electrode of N channel MOSFET 26. The source electrode of MOSFET 26 is connected by conductor 28 to one terminal of a trimmable resistor 27 and to the inverting input of operational amplifier 31. The other terminal of resistor 27 is connected to ground.

The output of operational amplifier 31 is connected to the gate electrode of MOSFET 26. The non-inverting input of operational amplifier 31 is connected by conductor 32 to the junction between resistors 33 and 34, which are connected in series between the +2.5 volt reference voltage and ground to produce a 0.2 volt level on conductor 32 and hence on conductor 28. The 2.5 volt reference voltage can be the same as or different than $V_{REF}$, and the 0.2 volt level can be replaced by another value.

It should be appreciated that the channel resistance of sampling MOSFET 6 is very non-linear with respect to changes of $V_{IN}$. Also problematic is the fact that the parasitic capacitance 7A from the source of sampling MOSFET 6 to its "P well" or body electrode is a relatively large, non-linear PN junction capacitance. Similarly, the parasitic capacitance 7B from the drain to the P well or body electrode of sampling MOSFET 6 is a relatively large non-linear PN junction capacitance. Parasitic capacitances 7C and 7D also are somewhat non-linear. Since parasitic capacitances 7A-D are large and non-linear, some of the input current that is supposed to charge sampling capacitor 13 is lost because it goes to charge parasitic capacitors 7A-7D.

In operation, if switches 14C, 22, and 29A are closed and the remaining switches in FIG. 1 are open, sampling of the scaled time-varying input voltage $V_{IN1}$ on conductor 5 by sampling MOSFET 6 achieves a low distortion reproduction of $V_{IN1}$ across sampling capacitor 13. This is because operational amplifier 11 maintains the body electrode voltage of sampling MOSFET 6 at nearly the source voltage $V_{IN1}$, and because operational amplifier 21 maintains the gate-to-source voltage of sampling MOSFET 6 at a constant value nearly equal to the constant gate-to-source voltage of MOSFET 24. The latter is achieved by operational amplifier 21 maintaining essentially equal voltages on conductors 5 and 25.

The gate-to-source voltage on MOSFET 24 is maintained at an essentially constant value despite the greatly varying values of $V_{IN}$ and $V_{IN1}$ by causing the current I flowing through MOSFET 24 to be essentially constant. The constant value of I necessarily keeps the channel resistance and hence the gate-to-source voltage of MOSFET 24 nearly constant, as long as MOSFET 24 remains in its current saturation region of operation, and provided also that the channel length of MOSFET 24 is sufficiently long to avoid an appreciable change in $V_{GS}$ of MOSFET 24 at the constant current I as the drain-to-source voltage of MOSFET 24 varies with changes in $V_{IN1}$. (It should be appreciated that MOSFET 24 could theoretically be replaced with a different resistive device coupled between the output and inverting input of operational amplifier 21, as long as I is maintained at a suitable constant value so that $V_{GS}$ of MOSFET 6 is held constant.)

Since the minimum value of $V_{IN1}$ is 0.3 volts, the voltage on conductor 28 is maintained at a lower voltage, chosen to be 0.2 volts, by operational amplifier 31, the non-inverting input of operational amplifier is maintained at 0.2 volts by the voltage divider circuit 33,34. Operational amplifier 31 therefore provides the necessary gate-to-source voltage on MOSFET 26 to supply the constant current I needed to maintain the constant 0.2 volts across resistor 27, despite large fluctuations in the drain voltage of MOSFET 26 on conductor 25.

In the described embodiment of the invention, the channel width and length of sampling MOSFET 6 are 500 microns and 3 microns, respectively. The channel width and length of MOSFET 24 are 45 microns and 12 microns, respectively, producing a gate-to-source voltage of approximately 1.5 volts for a value of I equal to approximately 30 microamperes. MOSFET 26 has a channel width of 500 microns and a channel length of 3 microns.

During the "tracking" mode operation of the circuit of FIG. 1, the outputs of operational amplifiers 11 and 21 are connected by switches 29A and 22 to the body electrode and gate electrode of sampling MOSFET 6, respectively. Switch 14C is closed, so the voltage on conductor 12 "tracking" or following $V_{IN1}$ is developed across sampling capacitor 13. Switches 29B, 23, 14A, and 14B all are open.

To switch from the tracking mode to the "hold" mode (in which a value of $V_{IN1}$ is accurately "captured" on sampling capacitor 13 for conversion into a digital value), switch 14C is opened. Then switches 22 and 29A are opened to disconnect the outputs of operational amplifiers 11 and 21 from the body and gate electrodes of sampling MOSFET 6, respectively. Switches 23 and 29B are closed to connect the body electrode and gate electrode of sampling MOSFET 6 to ground to ensure that it is completely off. Then switches 14A and 14B can be selectively opened and closed during conventional successive approximation testing of the voltage presently captured on sampling capacitor 13, one bit at a time starting with the MSB, until the contents of SAR 30 represent the presently sampled value of $V_{IN1}$, and hence the value of $V_{IN}$.

It should be noted that the sampled input voltage can be captured on more than just the MSB capacitor 13. One skilled in the art will recognize that the circuitry can be so arranged that the input voltage can be sampled on 2 or 3 or even all of the bit capacitors of the CDAC.

It should be appreciated that for the CMOS manufacturing process used in the embodiment of FIG. 1, a P channel source follower transistor could not be used in place of operational amplifier 11, because a body electrode of such a P channel source follower MOSFET would be at +5 volts. Therefore, there would be a considerable variation in the source-to-body voltage and hence in the threshold voltage of the source follower MOSFET as $V_{IN}$ varies, producing considerable non-linearity and harmonic distortion in the sampled output voltage. The approach for obtaining linearity of the channel resistance of an analog sampling switch described in the above-mentioned commonly assigned co-pending application cannot be used if asynchronous switching of the sampling MOSFET is required, unless a free-running clock circuit is provided to operate the bootstrap circuit disclosed in that patent application.

The implementation of the three operational amplifiers 11, 21, and 31 is straightforward. FIG. 3 shows an implementation of operational amplifier 21. In FIG. 3, P channel MOSFETs 40 and 41 form a differential input pair having load devices formed by diode-connected N channel MOSFETs 42 and 43, respectively. The current through MOSFET 43 is mirrored through N channel MOSFET 54 to flow through an N channel cascode MOSFET 53, the drain electrode of which is connected to output conductor 57. A capacitor 55 and a 5 kilohm resistor 56 form a compensation network. The current in diode-connected load MOSFET 42 is mirrored by N channel MOSFET 45 through cascode MOSFET 46 into a diode-connected P channel MOSFET 47, which is the control device of a PNP current mirror including P channel MOSFET 52. The drain of MOSFET 52 is connected to output conductor 57. This configuration provides high output impedance at conductor 57, which is desirable to increase the open loop gain of the operational amplifier, to improve the tracking of the body and gate electrodes of MOSFET 6 relative to its source. P channel MOSFETs 48, 44, and 51 form a current mirror to establish a constant bias current flowing through the differentially connected input MOSFETs 40 and 41 and to produce a constant bias current through diode-connected N channel MOSFETs 49 and 50 which bias the cascode MOSFETs 46 and 53.

The above-described embodiment of the invention provides a single power supply sampling circuit that provides very accurate boostrapping of an analog input voltage $V_{IN1}$ to the body electrode and the gate electrode of sampling MOSFET 6, to within as little as 10 to 20 millivolts of the analog input voltage $V_{IN1}$ at the Nyquist frequency, without the excess harmonic distortion that would be introduced by variation of the channel resistance of the sampling MOSFET in a conventional approach such as in FIG. 2. This result is achieved even though the input voltage varies both above and below ground.

As used herein, the term "constant" is intended to mean constant with respect to input signal variation, not necessarily constant with respect to other variables such as temperature or accuracy variations. Those skilled in the art know that when a MOSFET is connected so that bi-directional current flow is possible, the source electrode and the drain electrode are interchangeable. For example, in an N channel MOSFET, the current carrying terminal having the lower voltage is the source electrode and the other current carrying terminal is the drain electrode. It is intended that the terms "source electrode" and "drain electrode" as used herein not limit the intended operation of a MOSFET.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, a constant $V_{GS}$ voltage could be produced across the sampling MOSFET by forcing a properly compensated "constant current" through a resistor coupled between the inverting input and the output of operational amplifier 21.

What is claimed is:

1. A bootstrapped analog MOSFET sampling switch circuit, comprising in combination:
   (a) a sampling MOSFET having a drain electrode coupled to an output conductor;
   (b) a divider circuit coupling an analog input signal to a source electrode of the sampling MOSFET;

(c) a first operational amplifier having a non-inverting input coupled to the source electrode of the sampling MOSFET and an inverting input coupled to an output of the first operational amplifier and a body electrode of the sampling MOSFET;

(d) a second operational amplifier having an output coupled to a gate electrode of the sampling MOSFET and a non-inverting input coupled to the source electrode of the sampling MOSFET;

(e) a first MOSFET having a gate electrode coupled to the gate electrode of the sampling MOSFET, a drain electrode coupled to receive a positive supply voltage and a source electrode coupled to an inverting input of the second operational amplifier;

(f) a second MOSFET having a drain electrode coupled to the source electrode of the first MOSFET;

(g) a first resistor coupled between a source electrode of the second MOSFET and a ground voltage conductor;

(h) a third operational amplifier having an output coupled to a gate electrode of the second MOSFET, a non-inverting input coupled to a bias voltage source, and an inverting input coupled to the source electrode of the second MOSFET, whereby a constant current flows through the first MOSFET, maintaining constant its gate-to-source voltage, and thereby maintaining constant the gate-to-source voltage of the sampling MOSFET despite large variations in the analog input signal.

2. The bootstrapped analog MOSFET sampling switch circuit of claim 1 wherein the sampling MOSFET and the first and second MOSFETs are N channel MOSFETs.

3. The bootstrapped analog MOSFET sampling switch circuit of claim 2 wherein the first and second operational amplifiers are CMOS operational amplifiers.

4. The bootstrapped analog MOSFET sampling switch circuit of claim 3 wherein the divider circuit includes a first resistor coupling the analog input signal to the source electrode of the sampling MOSFET, a second resistor coupling the source electrode of the sampling MOSFET to the ground voltage conductor, and a third resistor coupling the source electrode of the sampling MOSFET to a reference voltage conductor.

5. The bootstrapped-analog MOSFET sampling switch circuit of claim 4 wherein the analog input signal is a sinusoidal signal varying between ±10 volts and wherein the positive supply voltage is provided from a single power supply having a nominal output voltage of 5 volts.

6. An analog-to-digital converter comprising in combination:

(a) a bootstrapped analog MOSFET sampling switch circuit including (1) sampling MOSFET having a drain electrode coupled by a sampling capacitor to an output conductor;

(2) a divider circuit coupling an analog input signal to a source electrode of the sampling MOSFET;

(3) a first operational amplifier having a non-inverting input coupled to the source electrode of the sampling MOSFET and an inverting input coupled to an output of the first operational amplifier and a body electrode of the sampling MOSFET;

(4) a second operational amplifier having an output coupled to a gate electrode of the sampling MOSFET and a non-inverting input coupled to the source electrode of the sampling MOSFET;

(5) a first MOSFET having a gate electrode coupled to the gate electrode of the sampling MOSFET, a drain electrode coupled to receive a positive supply voltage and a source electrode coupled to an inverting input of the second operational amplifier;

(6) a second MOSFET having a drain electrode coupled to the source electrode of the first MOSFET;

(7) a first resistor coupled between a source electrode of the second MOSFET and a ground voltage conductor;

(8) a third operational amplifier having an output coupled to a gate electrode of the second MOSFET, a non-inverting input coupled to a bias voltage source, and an inverting input coupled to the source electrode of the second MOSFET, whereby a constant current flows through the first MOSFET, maintaining constant its gate-to-source voltage, and thereby maintaining constant the gate-to-source voltage of the sampling MOSFET despite large variations in the analog input signal;

(b) a sampling capacitor having one terminal coupled to the drain electrode of the sampling MOSFET;

(c) a switched capacitor array coupled to another terminal of the sampling capacitor;

(d) comparator means for comparing a voltage on a junction between the sampling capacitor and the switch capacitor array with a predetermined threshold voltage;

(e) a successive approximation register means responsive to the comparator for switching the switched capacitor array and storing a digital successive approximation of a value corresponding to the analog input signal.

7. The analog-to-digital converter of claim 6 wherein the sampling MOSFET and the first and second MOSFETs are N channel MOSFETs.

8. The analog-to-digital converter of claim 7 wherein the first and second operational amplifiers are CMOS operational amplifiers.

9. The analog-to-digital converter of claim 8 wherein the divider circuit includes a first resistor coupling the analog input signal to the source electrode of the sampling MOSFET, a second resistor coupling the source electrode of the sampling MOSFET to the ground voltage conductor, and a third resistor coupling the source electrode of the sampling MOSFET to a reference voltage conductor.

10. The analog-to-digital converter of claim 9 wherein the analog input signal is a sinusoidal signal varying between ±10 volts and wherein the positive supply voltage is provided from a single power supply having a nominal output voltage of 5 volts.

11. A method of sampling an analog input signal that has a signal range above and below a ground reference voltage, the method comprising the steps of:

(a) scaling the analog input signal down to a lower magnitude such that all values of the scaled analog input signal are above the ground reference voltage;

(b) applying the scaled down analog input signal to a source electrode of a sampling MOSFET;

(c) maintaining a body-to-source voltage of the sampling MOSFET at approximately zero volts by applying the scaled down analog input signal to a non-inverting input of a first operational amplifier and applying an output voltage produced by the first operational amplifier to its inverting input and a body electrode of the sampling MOSFET;

(d) maintaining a gate-to-source voltage of the sampling MOSFET at a constant value independent of analog input signal variation by i. applying the scaled down analog input signal to a non-inverting input of a second operational amplifier, ii. applying an output of the second operational amplifier to a gate electrode of the sampling MOSFET and to a gate electrode of a first MOSFET, and iii. causing a constant current to flow through the first MOSFET and applying a resulting voltage on the source electrode of the first MOSFET to an inverting input of the second operational amplifier.

12. The method of claim 11 including producing the constant current by maintaining a constant voltage on the source electrode of a second MOSFET by means of a third operational amplifier having a predetermined reference voltage applied to its non-inverting input, applying an output signal of the third operational amplifier to the gate electrode of the second MOSFET, and applying a voltage on the source electrode of the second MOSFET to an inverting input of the third operational amplifier, and also applying the voltage on the source electrode of the second MOSFET to one terminal of a resistor having another terminal connected to the ground reference voltage, and coupling a drain electrode of the second MOSFET to the source electrode of the first MOSFET, thereby causing the constant current to flow through the resistor, the second MOSFET, and the first MOSFET.

13. A circuit for sampling an analog input signal that has a signal range above and below a ground reference voltage, the circuit comprising in combination:

(a) means for scaling the analog input signal down to a lower magnitude such that all values of the scaled analog input signal are above the ground reference voltage;

(b) means for applying the scaled down analog input signal to a source electrode of a sampling MOSFET;

(c) means for maintaining a body-to-source voltage of the sampling MOSFET at approximately zero volts by applying the scaled down signal to a non-inverting input of a first operational amplifier;

(d) means for applying an output voltage produced by the first operational amplifier to its inverting input and a body electrode of the sampling MOSFET;

(e) means for maintaining a gate-to-source voltage of the sampling MOSFET at a constant value independent of analog input signal variation, including i. first means for applying the scaled down analog input signal to a non-inverting input of a second operational amplifier, ii. second means for applying an output of the second operational amplifier to a gate electrode of the sampling MOSFET and to a gate electrode of a first MOSFET having a drain coupled to a positive supply voltage, and iii. third means coupled to the source of the first MOSFET for causing a constant current to flow through the first MOSFET and applying a resulting voltage on the source of the first MOSFET to an inverting input of the second operational amplifier.

14. The circuit of claim 13 wherein the third means includes means for producing the constant current by maintaining a constant voltage on the source electrode of a second MOSFET with a third operational amplifier having a predetermined reference voltage applied to its non-inverting input, means for applying an output signal of the third operational amplifier to the gate electrode of the second MOSFET, means for applying a voltage on the source electrode of the second MOSFET to an inverting input of the third operational amplifier, means for applying the voltage on the source electrode of the second MOSFET to one terminal of a resistor having another terminal connected to the ground reference voltage, and means for coupling a drain electrode of the second MOSFET to the source electrode of the first MOSFET, thereby causing the constant current to flow through the resistor, the second MOSFET, and the first MOSFET.

15. An integrated circuit bootstrapped analog MOSFET sampling switch circuit, comprising in combination:

(a) a sampling MOSFET having a drain electrode coupled to an output conductor, a source electrode coupled to receive an analog input voltage, a gate electrode, and a body electrode;

(b) first means coupled between the body and source electrodes for maintaining a constant voltage relationship between the body electrode and the source electrode;

(c) second means comprising a first MOSFET coupled between the gate electrode and the source electrode for maintaining a constant gate-to-source voltage across the sampling MOSFET in response to a constant current flowing through the first MOSFET of the second means; and (d) means coupled to the second means for forcing the constant current through the first MOSFET of the second means substantially independently of the analog input voltage.

16. The integrated circuit bootstrapped analog MOSFET sampling switch circuit of claim 15 wherein the first MOSFET is coupled to the gate electrode of the sampling MOSFET and also coupled to the constant current forcing means to produce the constant gate-to-source voltage across the sampling MOSFET during a sampling period.

17. A method of sampling an analog input signal that has a signal range above and below a ground reference voltage, the method comprising the steps of:

(a) applying the analog input signal to a source electrode of a sampling MOSFET;

(c) maintaining a body-to-source voltage of the sampling MOSFET at approximately zero volts by applying the scaled down analog input signal to a non-inverting input of a first operational amplifier and applying an output voltage produced by the first operational amplifier to its inverting input and a body electrode of the sampling MOSFET;

(d) maintaining a gate-to-source voltage of the sampling MOSFET at a constant value independent of analog input signal variation by
  i. applying the analog input signal to a non-inverting input of a second operational amplifier,
  ii. applying an output of the second operational amplifier to a gate electrode of the sampling MOSFET and to a gate electrode of a first MOSFET, and
  iii. causing a constant current to flow through the first MOSFET and applying a resulting voltage on the source electrode of the first MOSFET to an inverting input of the second operational amplifier.

* * * * *